Dec. 19, 1961 E. J. CROOP ET AL 3,013,913

MOLDED PRINTED CIRCUIT

Filed Aug. 30, 1957

WITNESSES:
Bernard R. Gieguez
Charles L. Menzemer

INVENTORS
Edward J. Croop &
Charles H. Vondracek.
BY
Frederick Shapoe
ATTORNEY

United States Patent Office
3,013,913
Patented Dec. 19, 1961

3,013,913

MOLDED PRINTED CIRCUIT

Edward J. Croop, Pittsburgh, and Charles H. Vondracek, Wilkins Township, Allegheny County, Pa., assignors to Westinghouse Electric Corporation, East Pittsburgh, Pa., a corporation of Pennsylvania Filed Aug. 30, 1957, Ser. No. 681,213
5 Claims. (Cl. 154—43)

This invention relates to printed electrical circuits and is particularly concerned with a process for molding printed electrical circuit members and the resultant product.

The expansion of the electrical industry has led to the development of numerous processes for the manufacture of printed circuits. Certain of such prior known processes are wasteful of material, require many steps, and do not produce a product in which the electrical conductor is bonded securely to the base member.

The object of this invention is to provide a process for molding a printed circuit member in which a conductor comprising coalesced particles of a metal arranged in a predetermined pattern is bonded integrally to an insulating base member.

A further object of this invention is to provide a printed circuit member in which an electrical conductor, comprising bonded conductive particles, forms the circuit in relief and is bonded integrally to an insulating base member by interpenetration of the particles of the conductor by said base member.

Other objects of the invention will, in part, be obvious and will, in part, appear hereinafter.

For a better understanding of the nature and objects of the invention, reference should be had to the following drawings and description in which.

Figure 1:
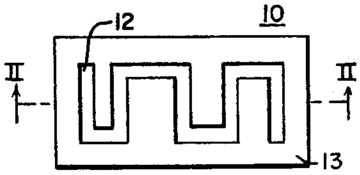
FIG. 1 is a top view of a rigid non-deformable die block with cavities corresponding to an electrical circuit diagram impressed therein.

In accordance with the present invention and in the attainment of the foregoing objects, broadly there is provided a process for producing printed circuits comprising (1) charging an electrically conductive metal powder into a recess of predetermined design in a rigid die member, covering the surface of the die, including the area above the recess, with a moldable insulating composition, (2) subjecting the moldable composition to pressure and heat to cause it to soften or liquefy so as to penetrate between the metal powder particles and (3) then solidifying the composition whereby the moldable composition is bonded to the electrically conductive metal powder and a suitable insulating base for the circuit results. By this process, there results a novel member comprising a solidified molded electrically insulating base member and an electrically conducting relief surface of conductive metal particles in the pattern of an electrical circuit, joined integrally thereto.

More specifically, the die member is comprised of any rigid non-deformable material such as steel, cast iron, aluminum, beryllium-copper alloy or the like. A circuit design is recessed into the die member by any conventional means such as electroetching, milling, profiling, photo-engraving, hobbing or the like. The depth of said recess has been found not to be critical and may range from 2 to 50 mils. Particularly satisfactory results have been realized when the circuit design is recessed approximately 25 mils.

Into the recess so produced in the die, there is disposed a quantity of fine particles of electrical conductive material, for example, copper, tin-coated copper, silver, bronze, mixtures or alloys of these metals or the like, having an average particle size of from less than 20 to 220 microns. Ordinarily the quantity of the metal powder is sufficient to substantially fill the recess. Copper powder having an average particle size up to about 150 microns has been found to be particularly satisfactory. Moreover, non-spherical, dendritic copper particles having an average outside dimension of 27 microns when applied in this invention, produced an excellent circuit member with a resistivity of less than 0.1 ohm.

After charging the recess, any surplus metal powder is removed from the surface of the die to prevent short circuiting between portions of the circuit.

Thereafter, the surface of the die, including the area above the electrical conductive metal powder is covered with a suitable moldable composition or molding compound which may comprise a moldable binder, such as phenolformaldehyde, melamine-formaldehyde, urea-formaldehyde, siloxane, polyester, epoxy, silicone rubber, nylon, polytetrafluorethylene, trifluorochloroethylene, and calcium silicate cement and from 25% to 40% by weight of filler such as asbestos fibers, wood flour, clay, silica, mica powder and wollastonite. Both organic and inorganic moldable compositions may be used.

Both thermosetting and the thermoplastic organic compositions may be used. The primary requirement for such compositions is that after tubes and other components are positioned on the printed circuit, the assembled unit may be floated for a brief period on a solder bath, said bath being at a temperature of approximately 225° C., with the printed circuit placed downwardly in contact with the hot solder. Therefore, when a thermoplastic resin base molding material is utilized, it should be selected from those that do not deform or soften seriously at or below 250° C., for example, a suitable material is polytetrafluorethylene. If, however, the components are hand soldered the thermoplastic resin may be selected from these that do not deform or soften seriously at or below 175° C., such as nylon.

The die member, prepared as described above, may be employed in any type of compression press. Thus it can form the base of a bench type compression mold. The mold with its charge is placed in the press, is closed and a suitable temperature and pressure is applied for a suitable time, such as 150° C. and 2000 p.s.i. for 5 minutes. However the temperature may vary in the range of 80° C. to 250° C., and the pressure may vary in the range of 100 p.s.i. to 5000 p.s.i. As a result of said treatment the binder in the molding composition softens or liquefies and flows around and between the interstices of the metal particles, bonding said particles together and on further reaction the binder solidifies and bonds the coalesced metal particles integrally to the solidified base member.

If the moldable composition forming said base member is comprised of a thermosetting resin and filler the result of the aforesaid heat and pressure will be to cure the resin to a thermoset state. If, however, the moldable composition is comprised of a thermoplastic resin and filler, the application of heat and pressure will cause the resin to flow around and between the interstices of the metal particles but it is necessary to cool the resin while still in the mold to solidify it and to produce a solid base member and bind the metal particles together and to it.

If the base member is composed of an inorganic moldable material such as finely divided alkaline earth materials of the group including lime and magnesia, finely divided hydrated aluminosilicic acid such as clay, shale or slate, and a mineral filler such as asbestos, and water, the application of the aforesaid heat and pressure will cause the inorganic moldable material to flow around and between the interstices of the metal particles thereby binding said particles together and integrally to the solidified base member.

In another embodiment of this invention, a suitable potentially reactive resin treated paper or cloth or the like, such as phenolic resin coated kraft paper, melamine aldehyde coated paper, and phenolic resin coated glass cloth, may be deposited between the electrical conducting metal powder and the powdered molding composition before treating in the compression mold in accordance with the invention, as described above. This modification employed resin treated sheet material reduces the migration of the electrical conducting metal powder caused by the molding composition flowing under pressure and permits the satisfactory use of a metal powder having an average particle size of substantially less than 20 microns, for example, 5 microns.

While the molded printed circuit members may be employed without further treatment, in some cases, plating of the printed circuit with a suitable electrically conductive metal, such as copper, tin, or silver may be effected to increase the amount of electrically conductive metal in said circuit.

In still another embodiment of this invention a preform of the moldable composition may be employed. Said preform will have the same area as the upper surface of the recessed die member. The mold with the applied preform disposed over the metal powder in the recess may be hot molded as described above, whereby a printed circuit member comprising an electrical conductor bonded integrally to an insulating base member is formed.

A still further modification of the process and product of this invention comprises molding members with holes and sockets in place. This process comprises impressing a circuit diagram into a die to form a recess, drilling or forming passageways through said die member at predetermined positions in the recess, said predetermined positions being the location of electronic components or their leads in the circuit. Then spring-loaded rods are inserted into said passageways in the die whereby one end of each of said rod is flush with the surface of the die member and the other end projects on the other side of the die member. The recess is charged with the electrical conductive metal powder and the die surface containing the recess is covered with a layer of molding composition. The die member is placed in a compression molding press. Said die member comprises the bottom of a compression mold. A mating member of said mold having passageways therethrough corresponding to said passageways in the die member comprises the top member of the compression mold. Upon operation of the press, the rods are extended through the die member into the corresponding passageways of the top member and the mold is subjected to heat and pressure. The resulting printed circuit member has sockets, holes and other passageways for the insertion of electronic components and is bonded integrally to the insulating base member.

Referring to the drawing, FIG. 1 shows a die member 10 composed of a rigid non-deformable metal with a recess 12 corresponding to a circuit diagram formed in the upper surface 13, which recess may be produced or impressed therein by any suitable method. It has been found that particularly satisfactory circuits result when the recess 12 is of a depth of approximately 25 mils. However, this depth is not critical and recesses of from 2 to 50 mils, for instance, have been found to be satisfactory. The width of the recess 12 depends on the electrical current to be carried.

Figure 2:
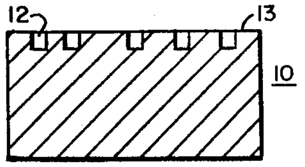
FIG. 2 is a cross-sectional view of the rigid non-deformable die block shown in FIG. 1 taken along the line II—II.

FIG. 2 is a cross sectional view of the die member 10 of FIG. 1 taken along line II—II and shows the recess 12 representing the electric circuit.

Figure 3:
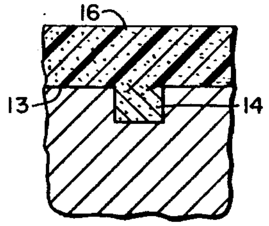
FIG. 3 is an enlarged, fragmentary, cross-sectional view of a portion of the right end of the die block shown in FIG. 2.

As shown in FIG. 3 the recess 12 is charged with an electrically conducting metal powder 14 to the upper surface 13 of the die. A layer of moldable composition 16 is applied over the entire surface 13 in accordance with this invention.

Figure 4:
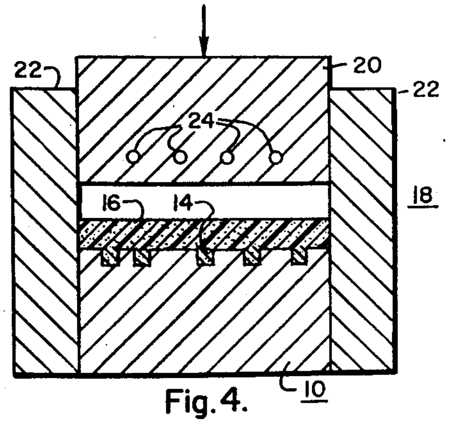
FIG. 4 is a cross-sectional view of a bench type compression mold including the rigid non-deformable die block shown in FIG. 2 as the base member.

FIG. 4 shows a bench-type compression mold 18. The mold comprises a top member 20 with passageways 24 therethrough for introduction of heating or cooling fluids or the equivalent, and confining sleeve-like side members 22. The die member 10 is charged with the electrical conducting metal powder 14 and molding composition 16 in accordance with this invention. The top member 20 is heated and pushed down by a ram (not shown) to apply a suitable pressure to composition 16. After the composition 16 is compressed and caused to flow to penetrate into the coalesced powder particles 14. The member 20 is cooled.

Figure 5:
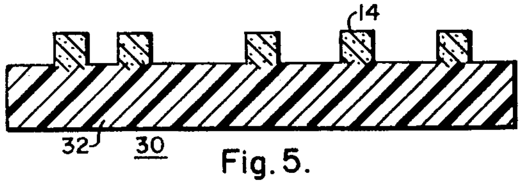
FIG. 5 is a cross-sectional view through a printed circuit member prepared in accordance with this invention.

After the molding operation, there is produced a printed circuit member 30 as shown in cross-section in FIG. 5 with a circuit composed of coalesced particles of the electrical conductive metal powder 14 bonded integrally to an electrically insulating base member 32. Some set binder has penetrated into the coalesced mass of powder 14. Said member 32, a cured or solidified, organic or inorganic, molded composition unites the metal powder 14 into an integral unit therewith.

Figure 6:
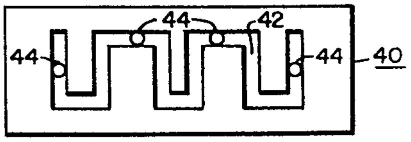
FIG. 6 is a top view of the die shown in FIG. 1 modified in accordance with the invention.

FIG. 6 shows a rigid non-deformable die member 40, with a recess 42 corresponding to a circuit diagram which is produced or impressed therein by any suitable method, and holes or passageways 44 through said member 40.

Figure 7:
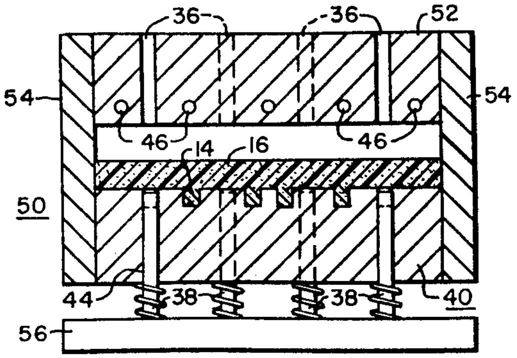
FIG. 7 is a cross-sectional view of a bench type compression mold with the modified die of FIG. 6 constituting the base member.

FIG. 7 shows a cross-sectional view of the bench type compression mold 50 comprising the die member 40, a top die member 52, said top die member 52 containing passageways 36, and heating and cooling passages 46, confining side members 54, and a mounting member 56. The passageways 36 in said top member 52 corresponds to the passageways 44 in the die member 40. Spring loaded rods 38 pass through passageways 44. One end of each of said rods 38 is, when the mold is open, flush with the top of said die 40. The other end of said rod rests upon the said mounting member 56. The rods 38 are spring loaded, whereby when the mold is closed the weight thereof causes the mounting member 56 to be brought into contact with the die member 40 and said rods 38 pass through composition 16 and extend into passageways 36 in the top member 30. Thereafter heat and pressure are applied to coalesce the powder particle 14 and to cure the composition 16 to produce a bonded unitary printed circuit member.

The following examples are illustrative of the practice of this invention.

*Example I*

A die is prepared by applying a tracing of a circuit diagram on a 3" x 5" x ½" steel block and then milling the design into the block by following the tracing to a depth of 5 mils. The recess thus formed is charged with about 4 grams of copper powder having an average particle size of 20 microns. This substantially fills the recess, any excess of copper powder is removed from the rest of the upper surface of the die. The upper surface of the die, including the area above the metal charged recess, is covered with 10 grams of a catalyzed phenol-formaldehyde molding compound applied as a uniformly thick layer. A smooth surfaced steel block of the same area as the aforesaid metal die member, is placed on top of the phenol-formaldehyde molding compound and a rectangular steel sleeve having an opening and closing and fitting the steel block and steel die is placed around the aforesaid members to form a closed compression mold. A temperature of 150° C. and a pressure of 500 p.s.i. are impressed on the molding composition for a period of approximately 5 minutes. Then the die is opened and the molded printed circuit member is withdrawn. The printed circuit member is tested. It was found to function satisfactorily electrically. The metal circuit component could not be stripped from the molded base member short of breaking up the base member itself.

*Example II*

A die is prepared by reproducing a circuit diagram on a 3" x 5" x ½" steel block by photographic means and then milling the design into the block to a depth of approximately 25 mils. The recess thus formed is charged with 4 grams of copper powder having a particle size of 27 microns and being of the dendritic type. This substantially fills the recess. Any excess copper powder is carefully removed from the surface of the die. The surface of the die, including the area above the metal-charged recess, is covered with 10 grams of a catalyzed melamine-formaldehyde molding compound. A smooth surfaced steel block of the same area as the aforesaid metal member, is placed on top of the melamine formaldehyde molding compound and a rectangular steel member is placed around the aforesaid two steel members to form a bench-type compression mold. A temperature of 150° C. and a pressure of 2000 p.s.i. are impressed on the mold for a period of approximately 5 minutes. After maintaining the above-stated conditions, the mold is opened and the printed circuit member withdrawn and tested. It is found to function satisfactorily electrically and the circuit component could not be stripped from the molded base member short of destroying the base member thereof.

*Example III*

A die is prepared by reproducing a circuit diagram on a 3" x 5" x ½" steel block by photographic means and then milling the design into the block to a depth of approximately 25 mils. The recess thus formed is charged with 4 grams of copper powder having a dendritic particle of an outside size averaging 27 microns. The powder substantially fills the recess and any excess copper powder is removed from the surface of the die. The surface of the die, including the area above the metal charged recess, is covered with 30 grams of an inorganic moldable compound comprising finely divided alkaline earth materials, finely divided hydrated aluminosilicic acid and asbestos filler mixed with water. A smooth surfaced steel block of the same area as the aforesaid metal die member, is placed on top of the aforesaid inorganic moldable composition and a rectangular steel member is placed around the aforesaid two steel members to form a bench-type compression mold. A temperature of 200° C. and a pressure of 2000 p.s.i. are impressed on the mold for a period of approximately 5 minutes. After maintaining the above-stated conditions the die member is removed and the printed circuit is tested. It was found to function satisfactorily electrically. The metal circuit component could not be stripped from the molded base member short of breaking up the base member itself.

Equally satisfactory results are obtainable substituting tin, tin-coated copper, silver and bronze powders having an average particle size of 20 to 220 microns in Examples I, II and III.

Equally satisfactory results are obtainable using pressures of 750 p.s.i., 1000 p.s.i., 1250 p.s.i., 1500 p.s.i., and 1750 p.s.i. in Examples I and II.

Equally satisfactory results are obtainable using temperatures varying from 80° C. to 250° C. in Examples I, II and III.

*Example IV*

The procedure of Example I was repeated and the printed circuit member comprising copper upon removal from the bench-type compression mold was further copper plated to apply 2 mils thickness of copper to increase the conductivity.

Equally satisfactory results are obtainable by plating a printed circuit with tin, silver or bronze coatings on the coalesced particles.

*Example V*

The procedure of Example I was repeated with the additional step that a sheet of phenolic resin coated kraft paper 7 mils thick with resin present in amount equal to the weight of the paper was inserted between the metallic powder and the molding resin before treatment in the mold. The printed circuit thus formed was found to function satisfactorily electrically and the circuit cannot be readily stripped from the base.

Equally satisfactory results are obtainable by using phenolic resin coated 5 mil thick glass cloth in place of the phenolic coated kraft paper in Example IV.

*Example VI*

A test mold is prepared by reproducing a circuit diagram on a 3" x 5" x ½" steel block by photographic means and then milling the diagram into the block to a depth of 25 mils. A passageway is drilled through the mold member at a predetermined position. Said position being the loci of an electronic component in the circuit diagram. A spring-loaded rod is inserted through said passageway, one end of said rod being flush with the surface of the mold and the rod extending through the mold. 5 grams of silver powder, having an average particle size of 60 microns, is charged into the recess. This substantially fills the recess. Any excess silver powder is carefully removed from the surface of the mold. The surface of the mold, including the area above the metal charged recess, is covered with 10 grams of a catalyzed phenol formaldehyde molding compound. A smooth surface steel block, the same size as the mold member and having the passageways therethrough corresponding to the passageways in the mold member, is placed on top of the phenol formaldehyde molding compound and a rectangular steel member is placed around the aforesaid two steel members to form a bench-type compression mold. The spring loaded rod is pushed through the silver crystals and molding compound into the steel block forming the top of the bench type compression mold whereby when a temperature of 150° C. and a pressure of 1000 p.s.i. are impressed upon the mold for a period of approximately 5 minutes and the mold then dismantled a printed circuit is formed with a cavity extending through the circuit and base. The printed circuit, with an electrode tube positioned in the cavity was tested and found to function satisfactorily electrically and the circuit cannot readily be stripped from the base member.

*Example VII*

A test mold is prepared by reproducing a circuit diagram on a 3" x 5" x ½" steel block by photographic means and then milling the design into the block to a depth of 25 mils. The recess thus formed is charged with 4 grams of dendritic copper powder having an average particle size of 27 microns. This substantially filled the recess. Any excess copper powder is carefully removed from the surface of the mold. A preformed phenol formaldehyde member about ¼ inch thick and having approximately the same dimensional area as the mold, is laid on the surface of the mold. A smooth surface steel block, the same size as the mold member, is placed on top of said preformed phenol formaldehyde member and a rectangular steel member is placed around the aforesaid two steel members to form a bench type compression mold. A temperature of 150° C. and a pressure of 500 p.s.i. are impressed on the mold for a period of approximately 5 minutes. After maintaining the above stated conditions, the mold is opened and the printed circuit tested. It is found to function satisfactorily electrically and the circuit cannot be readily stripped from the base member.

Equally satisfactory results are obtainable by substituting urea-formaldehyde, polyester, epoxy, silicone rubber, polytetrafluoroethylene and polytrifluorochloroethylene as preformed base members in this Example VII.

Since certain changes in carrying out the above process and in the product embodying the invention may be made without departing from its scope, it is intended that the accompanying description and drawings be interpreted as illustrative and not limiting.

We claim as our invention:

1. An article of manufacture comprising a base and a metallic design in relief bonded to said base, said base comprising a solidified electrical insulating molded composition, said metallic design consisting essentially of electrical conductive metal powder coalesced and moldably bonded to said base by the interpenetration of the base material among the metal particles.

2. An article of manufacture comprising a base and a metallic design in relief bonded to said base, said base comprising a fully cured electrical insulating molded thermosetting composition, said metallic design consisting essentially of electrical conductive metal powder, said metal powder being selected from the group consisting of copper, tin, tin coated copper, silver, and mixtures and alloys in which copper, tin and silver are major components, said metal powder being coalesced and moldably bonded to said base by the interpenetration of the base material among the metal particles.

3. An article of manufacture comprising a base and a metallic design in relief bonded to said base, said base comprising a solidified electrical insulating molded thermoplastic composition, said metallic design consisting essentially of electrical conductive metal powder, said metal powder being selected from the group consisting of copper, tin, tin coated copper, silver, and mixtures and alloys in which copper, tin and silver are major components, said metal powder being coalesced and moldably bonded to said base by the interpenetration of the base material among the metal particles.

4. An article of manufacture comprising a base and a metallic design in relief bonded to said base, said base comprising a solidified electrical insulating molded inorganic composition, said metallic design consisting essentially of electrical conductive metal powder, said metal powder being selected from the group consisting of copper, tin, tin coated copper, silver, and mixtures and alloys in which copper, tin and silver are major components, said metal powder being coalesced and moldably bonded to said base by the interpenetration of the base material among the metal particles.

5. An article of manufacture comprising a printed circuit, said printed circuit comprising a base and a circuit diagram, said base comprising a fully cured electrical insulating molded thermosetting composition, said circuit diagram consisting of electrical conductive copper powder, said copper powder having an average crystal size of 27 microns and being non-spherical dendritic crystals, said copper powder being coalesced and moldably bonded to said base by the interpenetration of the base material among the copper particles.

References Cited in the file of this patent

UNITED STATES PATENTS

| | | |
|---|---|---|
| 239,792 | Hyatt | Apr. 5, 1881 |
| 1,742,516 | Mills | Jan. 7, 1930 |
| 1,910,391 | Howard et al. | May 23, 1933 |
| 2,594,915 | Guillemant | Apr. 29, 1952 |
| 2,679,569 | Hall | May 25, 1954 |
| 2,692,190 | Pritikin | Oct. 19, 1954 |
| 2,850,681 | Horton | Sept. 2, 1958 |

FOREIGN PATENTS

| | | |
|---|---|---|
| 570,877 | Great Britain | 1945 |
| 768,706 | Great Britain | Feb. 20, 1957 |